United States Patent
Garikipati et al.

(10) Patent No.: US 12,549,182 B2
(45) Date of Patent: Feb. 10, 2026

(54) OPTIMIZING CENTRAL PROCESSING UNIT (CPU) CACHE MEMORY DC POWER WITH RAIL VOTING SCHEME

(71) Applicant: QUALCOMM Incorporated, San Diego, CA (US)

(72) Inventors: Sreeharipriya Garikipati, Hyderabad (IN); Pragya Pande, Lucknow (IN); Ankur Mehrotra, Greater Noida (IN); Rohit Singh, Hyderabad (IN)

(73) Assignee: QUALCOMM Incorporated, San Diego, CA (US)

( * ) Notice: Subject to any disclaimer, the term of this patent is extended or adjusted under 35 U.S.C. 154(b) by 99 days.

(21) Appl. No.: 18/738,893

(22) Filed: Jun. 10, 2024

(65) Prior Publication Data

US 2025/0379578 A1 Dec. 11, 2025

(51) Int. Cl.
*H03K 19/00* (2006.01)
*H03K 19/20* (2006.01)

(52) U.S. Cl.
CPC ......... *H03K 19/0008* (2013.01); *H03K 19/20* (2013.01)

(58) Field of Classification Search
CPC .................. H03K 19/0008; H03K 19/20
See application file for complete search history.

(56) References Cited

U.S. PATENT DOCUMENTS 6,906,555 B2 * 6/2005 Ma .................... H04L 25/45
375/357

* cited by examiner

*Primary Examiner* — Daniel D Chang
(74) *Attorney, Agent, or Firm* — Loza & Loza LLP

(57) ABSTRACT

Aspects of the disclosure are directed to dc power consumption optimization in an extended reality (XR) device with thermal constraints. In accordance with one aspect, the disclosure includes performing a two-input logical AND operation using a first comparison state and a second comparison state as inputs to generate a first conjunctive output; performing a three-input logical AND operation using a third comparison state, a fourth comparison state and a fifth comparison state as inputs to generate a second conjunctive output; performing a two-input logical OR operation using the first conjunctive output and the second conjunctive output to generate a disjunctive output; and setting the disjunctive output to a select line for a two-input multiplexer to select either a processor voltage or a memory voltage as a voltage rail for an electrical load.

20 Claims, 9 Drawing Sheets

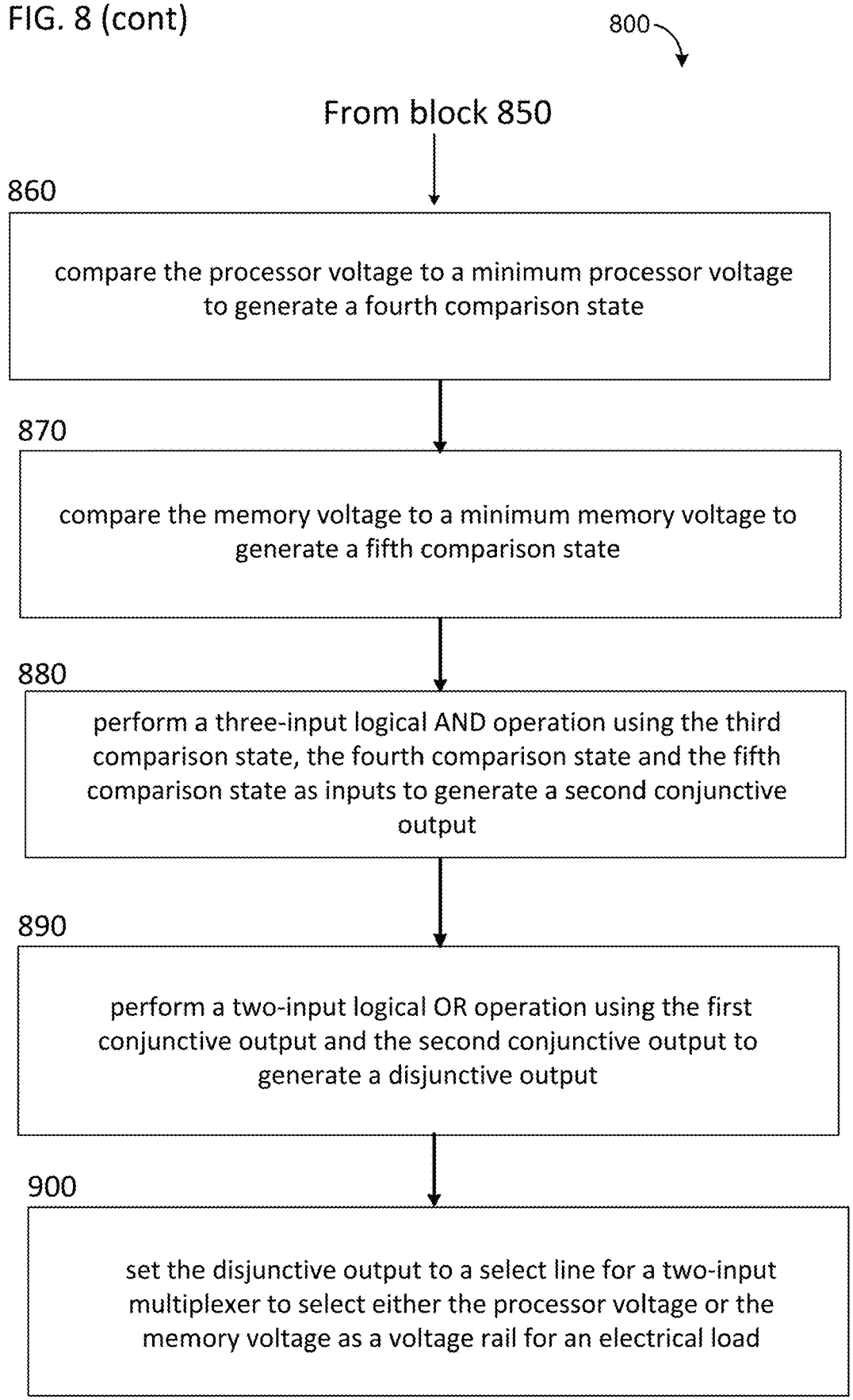

OPTIMIZING CENTRAL PROCESSING UNIT (CPU) CACHE MEMORY DC POWER WITH RAIL VOTING SCHEME

TECHNICAL FIELD

This disclosure relates generally to the field of information processing systems, and, in particular, to dc power consumption optimization in an extended reality (XR) device with thermal constraints.

BACKGROUND

Information processing systems for an extended reality (XR) device may include multiple processing engines, processors or processing cores for a variety of user applications. An information processing system may include a central processing unit (CPU), a graphics processing unit (GPU), a digital signal processor (DSP), an image signal processor (ISP), a neural processing unit (NPU), etc., along with input/output interfaces, a hierarchy of memory devices and associated interconnection databases. In certain use cases, the dc power consumption of the XR device must be minimized to limit the maximum temperature due to device thermal dissipation. A power rail voting scheme may allow optimal dc power management under specified thermal constraints.

SUMMARY

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

In one aspect, the disclosure provides dc power consumption optimization in an extended reality (XR) device with thermal constraints. Accordingly, an apparatus including: a two-input AND logical function configured to perform a two-input logical AND operation using a first comparison state and a second comparison state as inputs to generate a first conjunctive output; a three-input AND logical function configured to perform a three-input logical AND operation using a third comparison state, a fourth comparison state and a fifth comparison state as inputs to generate a second conjunctive output; a two-input OR logical function coupled to the two-input AND logical function and the three-input AND logical function, the two-input OR logical function configured to perform a two-input logical OR operation using the first conjunctive output and the second conjunctive output to generate a disjunctive output; and a multiplexer coupled to two-input OR logical function, the multiplexer configured to select either a processor voltage or a memory voltage as a voltage rail for an electrical load.

In one example, the two-input AND logical function is further configured to receive a first comparison of the processor voltage and the memory voltage. In one example, the two-input AND logical function is further configured to receive a second comparison of the processor voltage and a voltage threshold level. In one example, the two-input AND logical function is further configured to receive the first comparison state and the second comparison state. In one example, the two-input AND logical function is further configured to set the disjunctive output to a select line for a two-input multiplexer to select either the processor voltage or the memory voltage as the voltage rail for the electrical load.

Another aspect of the disclosure provides a method including: performing a two-input logical AND operation using a first comparison state and a second comparison state as inputs to generate a first conjunctive output; performing a three-input logical AND operation using a third comparison state, a fourth comparison state and a fifth comparison state as inputs to generate a second conjunctive output; performing a two-input logical OR operation using the first conjunctive output and the second conjunctive output to generate a disjunctive output; and setting the disjunctive output to a select line for a two-input multiplexer to select either a processor voltage or a memory voltage as a voltage rail for an electrical load.

In one example, the method further includes comparing the processor voltage to the memory voltage to generate the first comparison state. In one example, the method further includes comparing the processor voltage to a voltage threshold level to generate the second comparison state. In one example, the method further includes setting the first conjunctive output to TRUE if the first comparison state and the second comparison state are both TRUE; or setting the first conjunctive output to FALSE if either or both of the first comparison state and the second comparison state is FALSE.

In one example, the method further includes comparing the memory voltage to the processor voltage to generate the third comparison state. In one example, the method further includes comparing the processor voltage to a minimum processor voltage to generate the fourth comparison state. In one example, the method further includes comparing the memory voltage to a minimum memory voltage to generate the fifth comparison state.

In one example, the method further includes setting the second conjunctive output to TRUE if the third comparison state, the fourth comparison state and the fifth comparison state are all TRUE, or setting the second conjunctive output to FALSE if any of the third comparison state, the fourth comparison state or the fifth comparison state is FALSE. In one example, the method further includes determining the voltage threshold level. In one example, the method further includes setting the disjunctive output to TRUE if at least one of the first conjunctive output and the second conjunctive output is TRUE, or setting the disjunctive output to FALSE if both of the first conjunctive output and the second conjunctive output are FALSE. In one example, the method further includes selecting the processor voltage as the voltage rail for the electrical load if the disjunctive output is TRUE, or selecting the memory voltage as the voltage rail for the electrical load if the disjunctive output is FALSE.

Another aspect of the disclosure provides an apparatus including: means for performing a two-input logical AND operation using a first comparison state and a second comparison state as inputs to generate a first conjunctive output; means for performing a three-input logical AND operation using a third comparison state, a fourth comparison state and a fifth comparison state as inputs to generate a second conjunctive output; means for performing a two-input logical OR operation using the first conjunctive output and the second conjunctive output to generate a disjunctive output; and means for setting the disjunctive output to a select line for a two-input multiplexer to select either a processor voltage or a memory voltage as a voltage rail for an electrical load.

In one example, the apparatus further includes means for selecting the processor voltage as the voltage rail for the electrical load if the disjunctive output is TRUE, or for selecting the memory voltage as the voltage rail for the electrical load if the disjunctive output is FALSE. In one example, the apparatus further includes means for setting the second conjunctive output to TRUE if the third comparison state, the fourth comparison state and the fifth comparison state are all TRUE, or for setting the second conjunctive output to FALSE if any of the third comparison state, the fourth comparison state or the fifth comparison state is FALSE. In one example, the apparatus further includes means for setting the disjunctive output to TRUE if at least one of the first conjunctive output and the second conjunctive output is TRUE, or for setting the disjunctive output to FALSE if both of the first conjunctive output and the second conjunctive output are FALSE.

These and other aspects of the present disclosure will become more fully understood upon a review of the detailed description, which follows. Other aspects, features, and implementations of the present disclosure will become apparent to those of ordinary skill in the art, upon reviewing the following description of specific, exemplary implementations of the present invention in conjunction with the accompanying figures. While features of the present invention may be discussed relative to certain implementations and figures below, all implementations of the present invention can include one or more of the advantageous features discussed herein. In other words, while one or more implementations may be discussed as having certain advantageous features, one or more of such features may also be used in accordance with the various implementations of the invention discussed herein. In similar fashion, while exemplary implementations may be discussed below as device, system, or method implementations it should be understood that such exemplary implementations can be implemented in various devices, systems, and methods.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

While for purposes of simplicity of explanation, the methodologies are shown and described as a series of acts, it is to be understood and appreciated that the methodologies are not limited by the order of acts, as some acts may, in accordance with one or more aspects, occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with one or more aspects.

An information processing system, for example, a computing system with multiple slices (e.g., processing engines) or a system on a chip (SoC), may require multiple levels of coordination or synchronization. In one example, a slice may include a processing engine (i.e., a subset of the computing system) as well as associated memory units and other peripheral devices. In one example, execution of an application may be decomposed into a plurality of work tasks which are executed by multiple slices or multiple processing engines.

Figure 1:
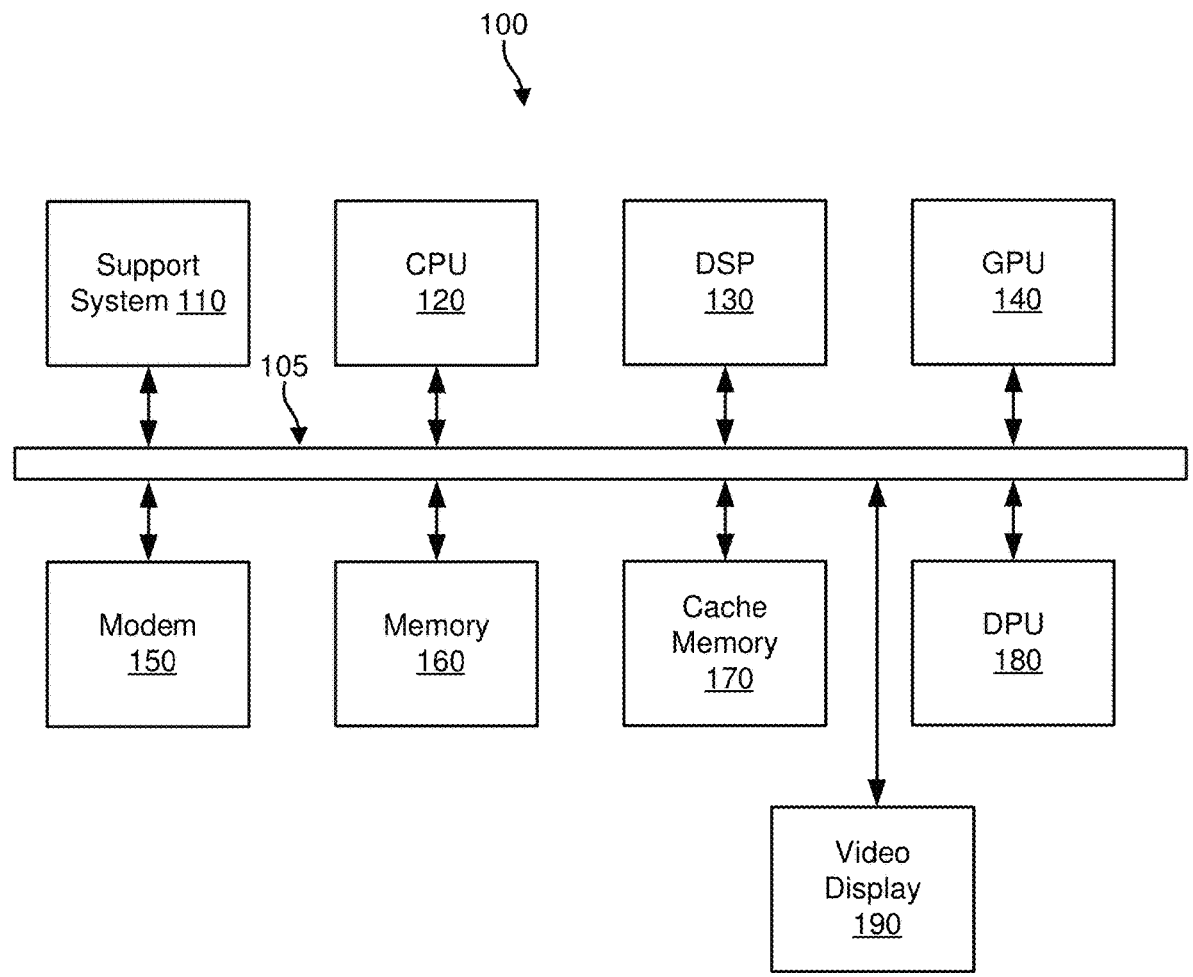
FIG. 1 illustrates an example information processing system.

FIG. 1 illustrates an example information processing system 100. In one example, the information processing system 100 includes a plurality of processing engines such as a central processing unit (CPU) 120, a digital signal processor (DSP) 130, a graphics processing unit (GPU) 140, a display processing unit (DPU) 180, etc. In one example, various other functions in the information processing system 100 may be included such as a support system 110, a modem 150, a memory 160, a cache memory 170 and a video display 190. For example, the plurality of processing engines and various other functions may be interconnected by an interconnection databus 105 to transport data and control information. In one example, the video display is coupled directly to the bus 105 as shown in FIG. 1.

For example, the memory 160 and/or the cache memory 170 may be shared among the CPU 120, the GPU 140s and the other processing engines. In one example, the CPU 120 may include a first internal memory which is not shared with the other processing engines. In one example, the GPU 140 may include a second internal memory which is not shared with the other processing engines. In one example, any processing engine of the plurality of processing engines may have an internal memory (i.e., a dedicated memory) which is not shared with the other processing engines. Although several components of the information processing system 100 are included herein, one skilled in the art would understand that the components listed herein are examples and are not exclusive. Thus, other components may be included as part of the information processing system 100 within the spirit and scope of the present disclosure.

In one example, one or more processing engines in the information processing system 100 may connect to a plurality of peripheral devices to provide additional functionality. The plurality of peripheral devices may include, for example, cameras, imagers, sensors, displays, speakers, microphones, etc. In one example, processor-peripheral device communications may be implemented by a bidirectional high-speed interface.

In one example, the information processing system 100 may be part of a wireless device in a wireless communication system. For example, the wireless communication system may conform to a wireless network protocol such as 4G LTE (long term evolution), 5G NR (new radio, etc.

In one example, an extended reality (XR) device is a device which provides an immersive sensory experience to a human user. In one example, the XR device may be an augmented reality (AR) device or a virtual reality (VR) device. The XR device may be an implementation of a simulation or "digital twin" environment which emulates a physical scenario with a machine-provided surrogate scenario.

Figure 2:
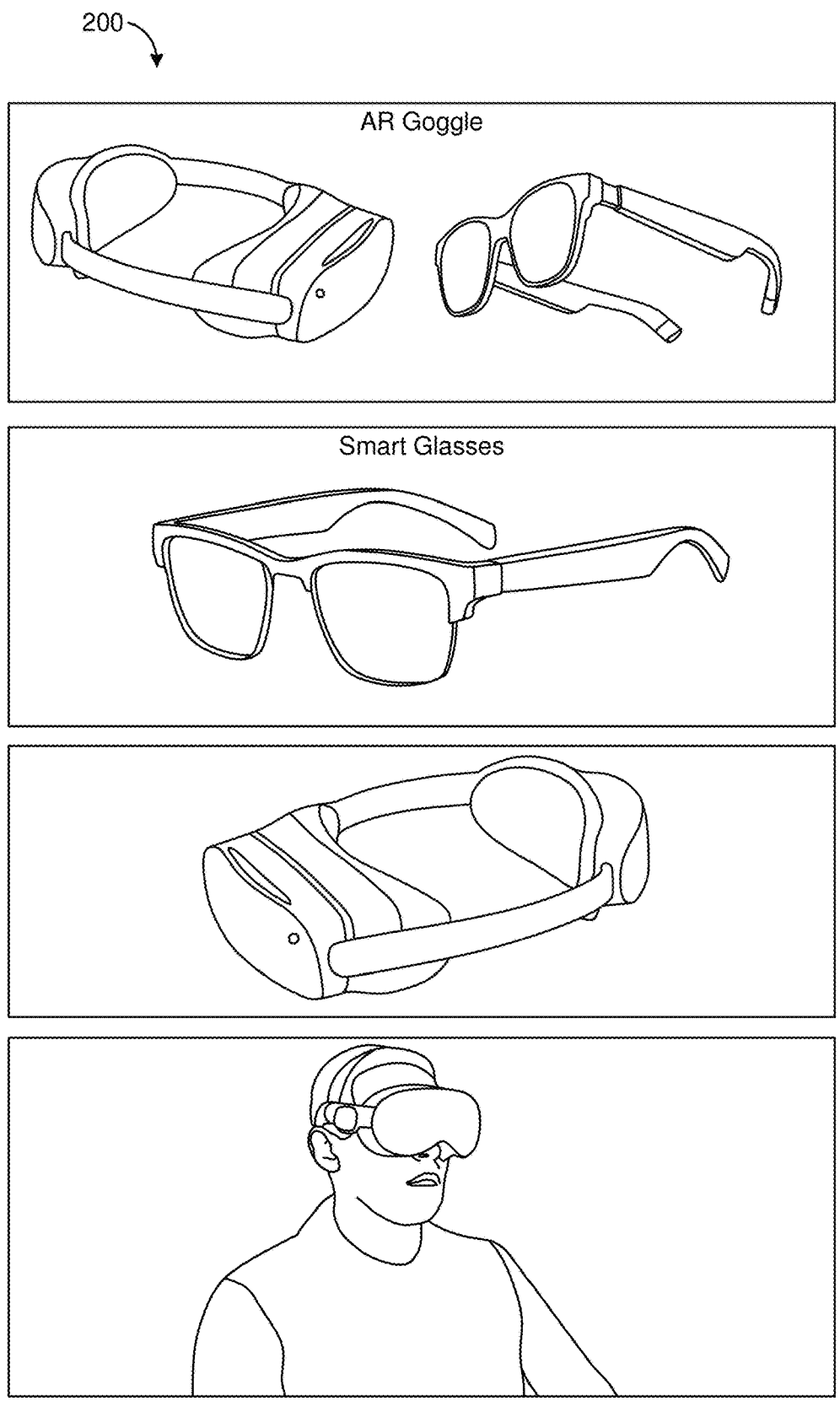
FIG. 2 illustrates example implementations of an extended reality (XR) device.

FIG. 2 illustrates example implementations 200 of an extended reality (XR) device. In one example, XR devices may be applied to a head-mounted device (HMD). For example, the HMD may be worn by a user to provide an immersive sensory environment. In one example, the XR device must conform to a stringent thermal constraint on a maximum allowable temperature, for example, a maximum skin temperature. In addition, the XR device may include a battery as a portable energy source with a battery life dependent on temperature and battery depth of discharge. Management of dc power is therefore a key ingredient in maintenance of a required operational temperature range and a maximum battery life. In addition, due to form factor and mass constraints in the head-mounted device, dc power management may be required in the XR device.

Figure 3:
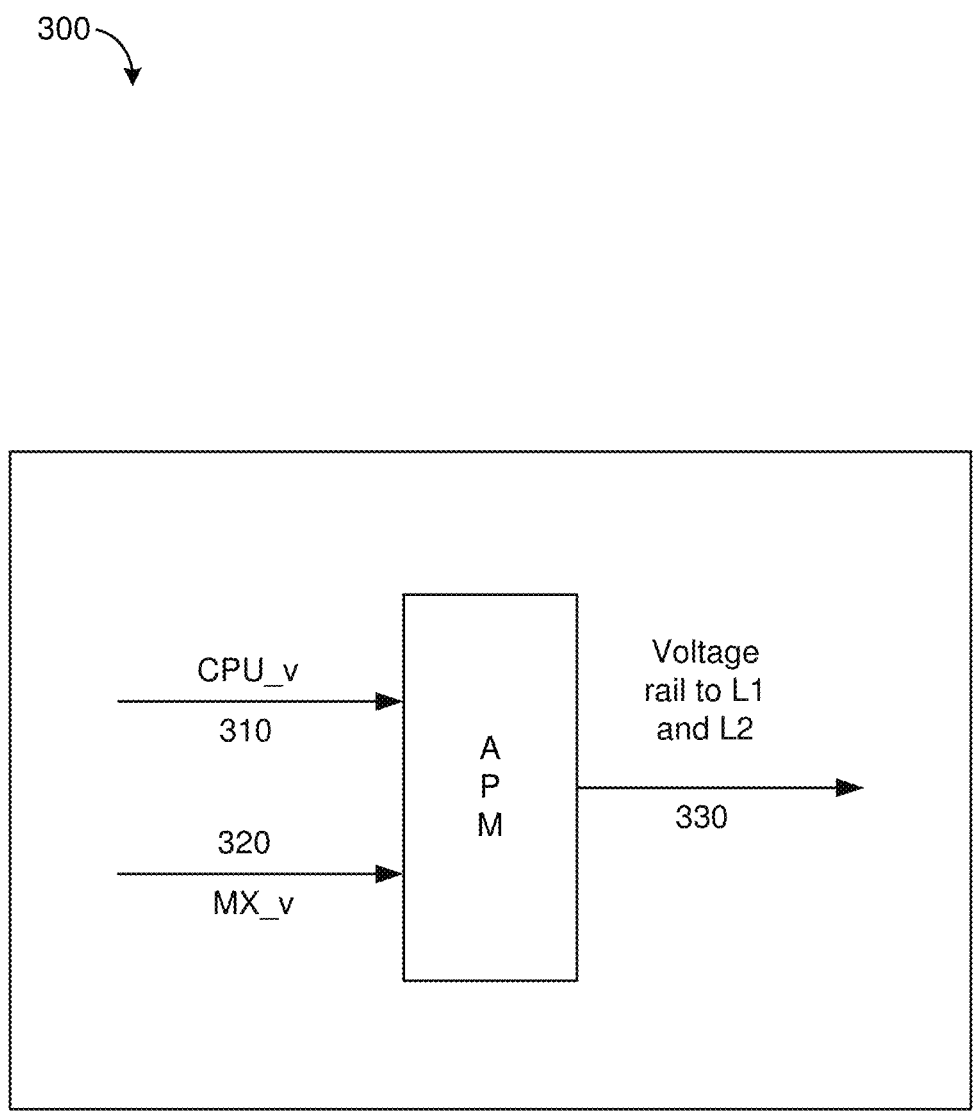
FIG. 3 illustrates an example power multiplexer (mux).

FIG. 3 illustrates an example power multiplexer (mux) 300. In one example, the power mux 300 includes a first input 310 and a second input 320. In one example, the first input 310 is a processor voltage (e.g., CPU_v) and the second input 320 is a memory voltage (e.g., MX_v). In one example, the power mux 300 connects either the first input 310 or the second input 320 to output 330, which is a voltage rail for an electrical load such as a plurality of cache memories. In one example, the plurality of cache memories includes a first level (L1) cache memory and a second level (L2) cache memory.

In one example, the power mux 300, also known as an array power mux (APM) controls the dc power domain for the electrical load such as the plurality of cache memories, including the L1 cache memory and the L2 cache memory. For example, the dc power domain includes the processor voltage (e.g., CPU_v) on a CPU_v voltage rail and the memory voltage (e.g., MX_v) on a MX_v voltage rail.

In one example, the power mux 300 may operate under a plurality of voltage scenarios which depend on voltage states of the processor voltage (e.g., CPU_v) and the memory voltage (e.g., MX_v). In one example, control logic for the plurality of voltage scenarios is summarized in the following Table 1:

TABLE 1

Control logic for the plurality of voltage scenarios.

| Scenario | CPU_v state | MX_v state | Power mux output to memories |
| --- | --- | --- | --- |
| 1 | Nominal & below | PerfLevel_1/PerfLevel_0 | MX_v rail |
| 2 | Nominal & below | >PerfLevel_1 | MX_v rail |
| 3 | Nominal_L1 & above | Below CPU_v voltage | CPU_v rail |

In one example, PerfLevel_0 and PerfLevel_1 are distinct voltage levels such that PerfLevel_0<PerfLevel_1.

In one example, a logical AND operation is implemented on the voltage states using, for example, the logical operation expressed as AND (is CPU_v>Threshold1, is CPU_v>MX_v). That is, the logical AND operation is equal to one if and only if both the processor voltage CPU_v is greater than a first threshold Threshold1 and the processor voltage CPU_v is greater than the memory voltage MX_v. For example, the first threshold Threshold1 is equal to Vref.

In one example, the logical AND operation, expressed in Boolean terminology, may be specified as a conjunctive operation, denoted with a symbol "$\wedge$". In one example, the conjunctive operation on two binary inputs x and y each with two possible states (e.g., TRUE, FALSE) produces a conjunctive output z expressed as $z=x \wedge y$, where z=TRUE if and only if x=TRUE and y=TRUE and z=FALSE otherwise. That is, the conjunctive output is set to TRUE only if all of its inputs are simultaneously TRUE. In one example, the conjunctive operation is completely defined by the expressions $0 \wedge 0 = 0 \wedge 1 = 1 \wedge 0 = 0$ and $1 \wedge 1 = 1$.

In one example, the logical OR operation may be specified as a disjunctive operation, denoted with a symbol "$\vee$". In one example, the disjunctive operation on two binary inputs p and q each with two possible states (e.g., TRUE, FALSE) produces a disjunctive output r expressed as $r=p \vee q$, where r=FALSE if and only if p=FALSE and q=FALSE and r=TRUE otherwise. That is, the disjunctive output is set to FALSE only if all of its inputs are simultaneously FALSE. In one example, the disjunctive operation is completely defined by the expressions $0 \vee 0 = 0$ and $0 \vee 1 = 1 \vee 0 = 1 \vee 1 = 1$.

In one example, use cases for XR devices may follow scenario 2 in the table above with the processor voltage CPU_v operating at a lower operational corner (i.e., CPU_v<nominal and the memory voltage MX_v operating at a higher operational corner (i.e., MX_v>PerfLevel_1). In one example, the control logic retains the plurality of cache memories (i.e., L1 cache memory and L2 cache memory) on the MX_v rail. As a result, the plurality of cache memories may pay a power penalty at the higher operational corner. Thus, for improved dc power performance with certain XR device use cases, an enhanced power mux capability is needed. In one example, the enhanced power mux capability may be attained by a modified control logic.

Figure 4:
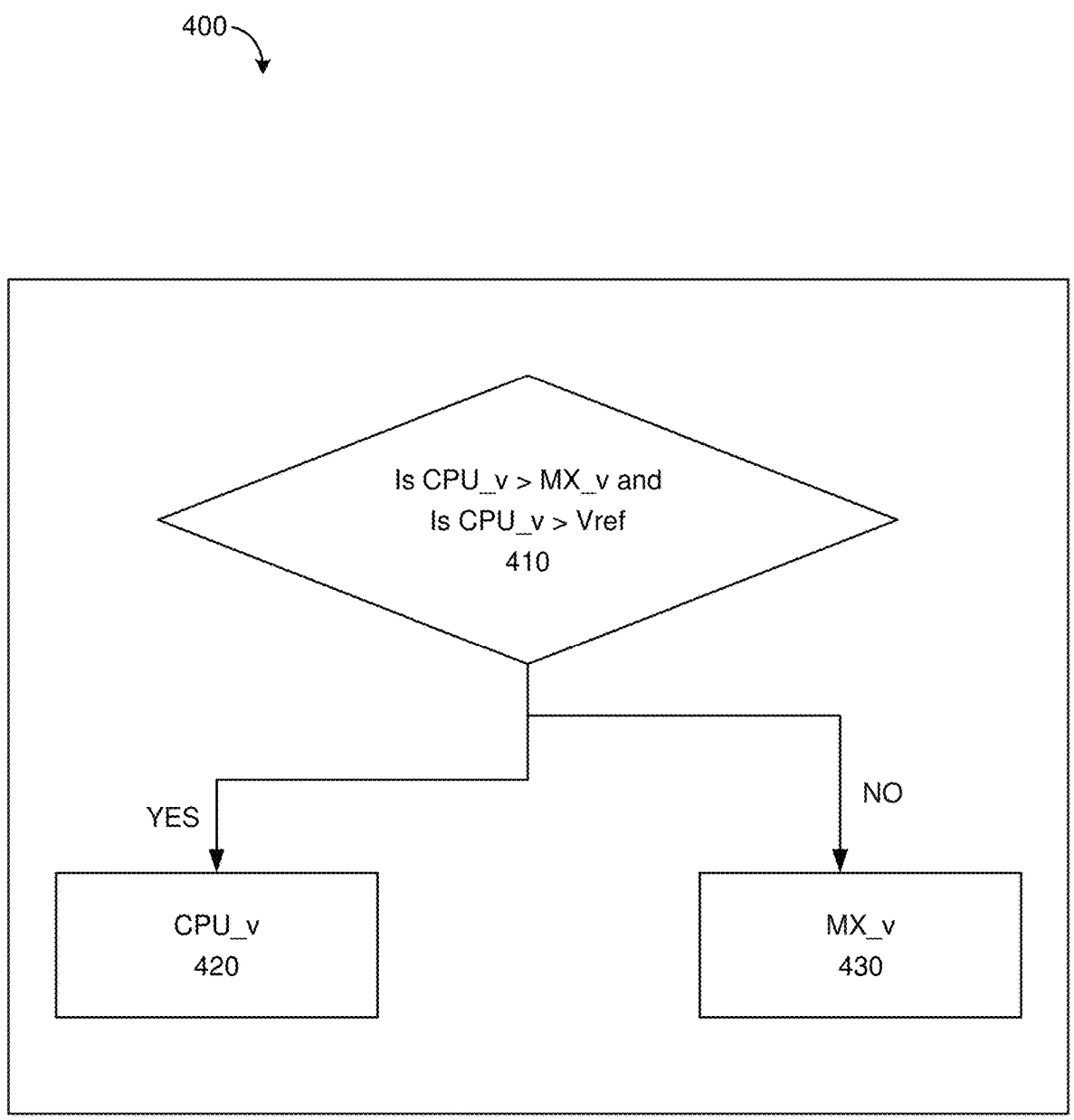
FIG. 4 illustrates an example of a first control logic flow diagram.

FIG. 4 illustrates an example of a first control logic flow diagram 400. In one example, the first control logic flow diagram selects a power mux input for a plurality of cache memories. In one example, block 410 is a first decision test to determine if both the processor voltage CPU_v is greater than the memory voltage MX_v and the processor voltage CPU_v is greater than a first threshold Threshold 1 (e.g., Threshold 1=Vref). If the first decision test results in a TRUE state (e.g., ONE state), then proceed to block 420. If the first decision test results in a FALSE state (e.g., ZERO state), then proceed to block 430. In block 420, select the CPU_v rail for the plurality of cache memories. In block 430, select the MX_v rail for the plurality of cache memories.

Figure 5:
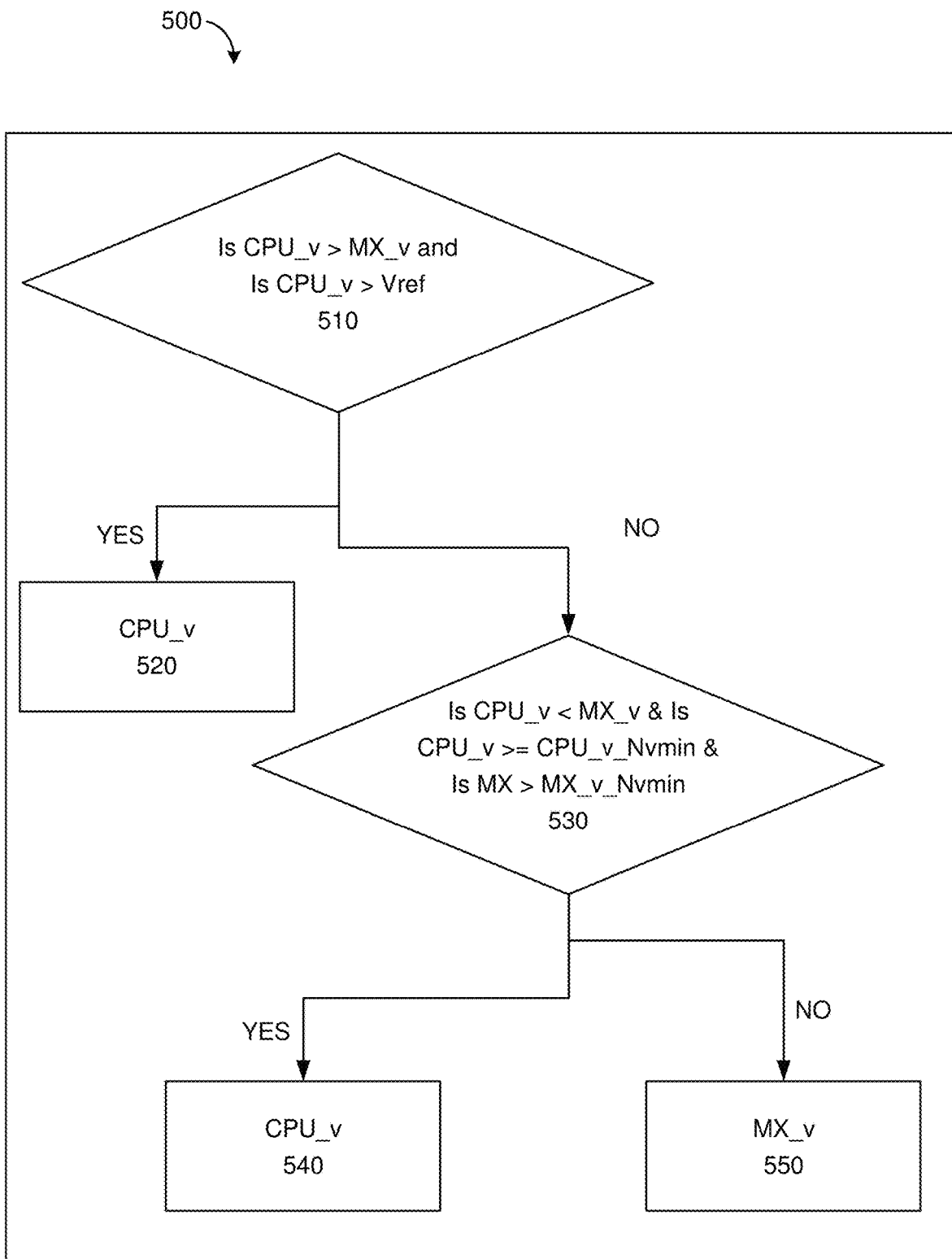
FIG. 5 illustrates an example of a second control logic flow diagram.

FIG. 5 illustrates an example of a second control logic flow diagram 500. In one example, the second control logic flow diagram 500 selects a power mux input for a plurality of cache memories. In one example, the second control logic enhances the power mux capability through power rail selection optimization. In one example, block 510 is a first decision test to determine if both the processor voltage CPU_v is greater than the memory voltage MX_v and the processor voltage CPU_v is greater than a first threshold Threshold 1 (e.g., Threshold 1=Vref). If the first decision test results in a TRUE state (e.g., ONE state), then proceed to block 520. If the first decision test results in a FALSE state (e.g., ZERO state), then proceed to a second decision test in block 530.

In one example, the second decision test includes a first subtest, a second subtest and a third subtest. In one example, the first subtest determines if the processor voltage CPU_v is less than the memory voltage MX_v. In one example, the second subtest determines if the processor voltage CPU_v is greater than or equal to a minimum processor voltage Nvmin. In one example, the third subtest determines if the memory voltage MX_v is greater than a minimum memory voltage MX_v_Nvmin. In one example, if the first subtest results in a TRUE state, the second subtest results in a TRUE state and the third subtest results in a TRUE state (i.e., all three subtests result in a TRUE state simultaneously), then proceed to block 540. Else, proceed to block 550. In one example, block 540, select the CPU_v rail for the plurality of cache memories. In one example, in block 550, select the MX_v rail for the plurality of cache memories.

In one example, the following Table 2 illustrates a comparison of logical code for the first logic control logic flow and the second control logic flow given mux inputs.

TABLE 2

Comparison of logical code.

| Mux inputs | First logic control | Second logic control |
|---|---|---|
| Select line | AND1(CPU_v > Thr1, CPU_v > MX_v) | OR1[AND1(CPU_v > Thr1, CPU_v > MX_v), AND2(MX_v > CPU_v, CPU_v ≥ CPU_v_Nvmin, _MX_v > MX_v_Nvmin)] |
| Input line (if select line = 1) | CPU_v | CPU_v |
| Input line (if select line = 0) | MX_v | MX_v |

In one example, comparison values in the logical code to determine the select line value may be configured in software based on semiconductor (e.g., silicon) voltage characterization. In one example, subsequent to voltage characterization, if the processor voltage (e.g., CPU_v) settling voltages are much lower than the memory voltage (e.g., MX_v) settling voltages, the output of the AND2 logical operations will be ZERO and cache memory will continue to obtain its voltage based on the output of the AND1 logical operation. In one example, the AND1 logical operation is a two-input AND logical function. In one example, the AND2 logical operation is a three-input AND logical function. In one example, the OR1 logical operation is a two-input OR logical function.

Figure 6:
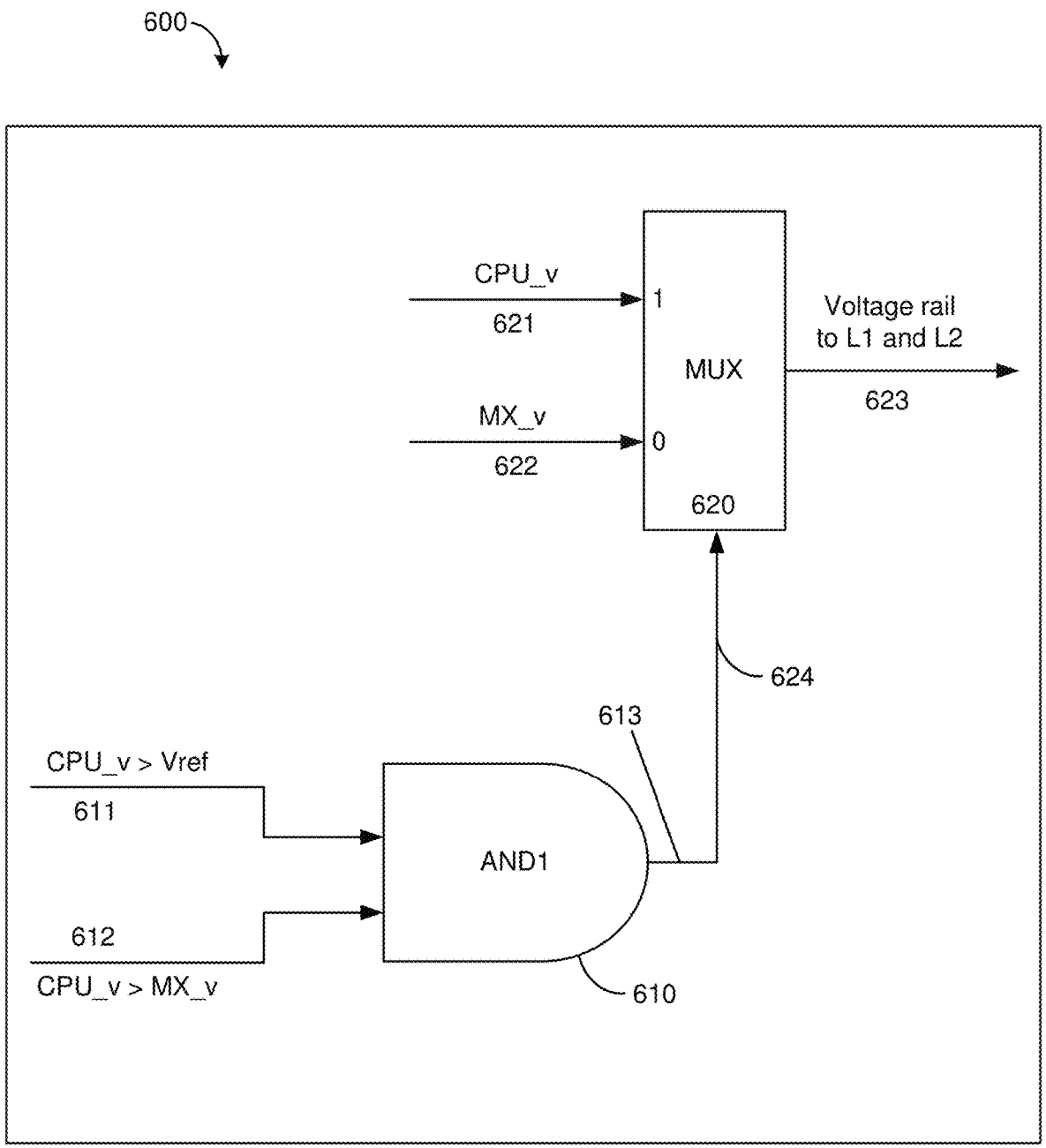
FIG. 6 illustrates an example of a first implementation of control logic.

FIG. 6 illustrates an example of a first implementation of control logic 600. In one example, a two-input AND logical function AND1 610 accepts a first input CPU_v>Thr1 611 and a second input CPU_v>MX_v 612. In one example, Thr1=Vref. In one example, the two-input AND logical function AND1 610 produces a first output 613 which has a value ONE (i.e., TRUE) if and only if both the first input 611 and the second input 612 have the value ONE (i.e., if both are TRUE). Otherwise, the first output 613 has a value ZERO (i.e., FALSE). In one example, the first output 613 serves as a select line 624 for multiplexer 620. In one example, the multiplexer 620 accepts a first mux input CPU_v 621 and a second mux input 622 MX_v 622. In one example, the multiplexer selects either the first mux input 621 or the second mux input 622 as a mux output 623, depending on the state of the select line 624. For example, if the select line has a value ZERO (i.e., FALSE), the mux output 623 is set to the first mux input 621. For example, if the select line has a value ONE (i.e., TRUE), the mux output 623 is set to the second mux input 622. In one example, the mux output 623 serves as a selected voltage rail for a plurality of cache memories.

Figure 7:
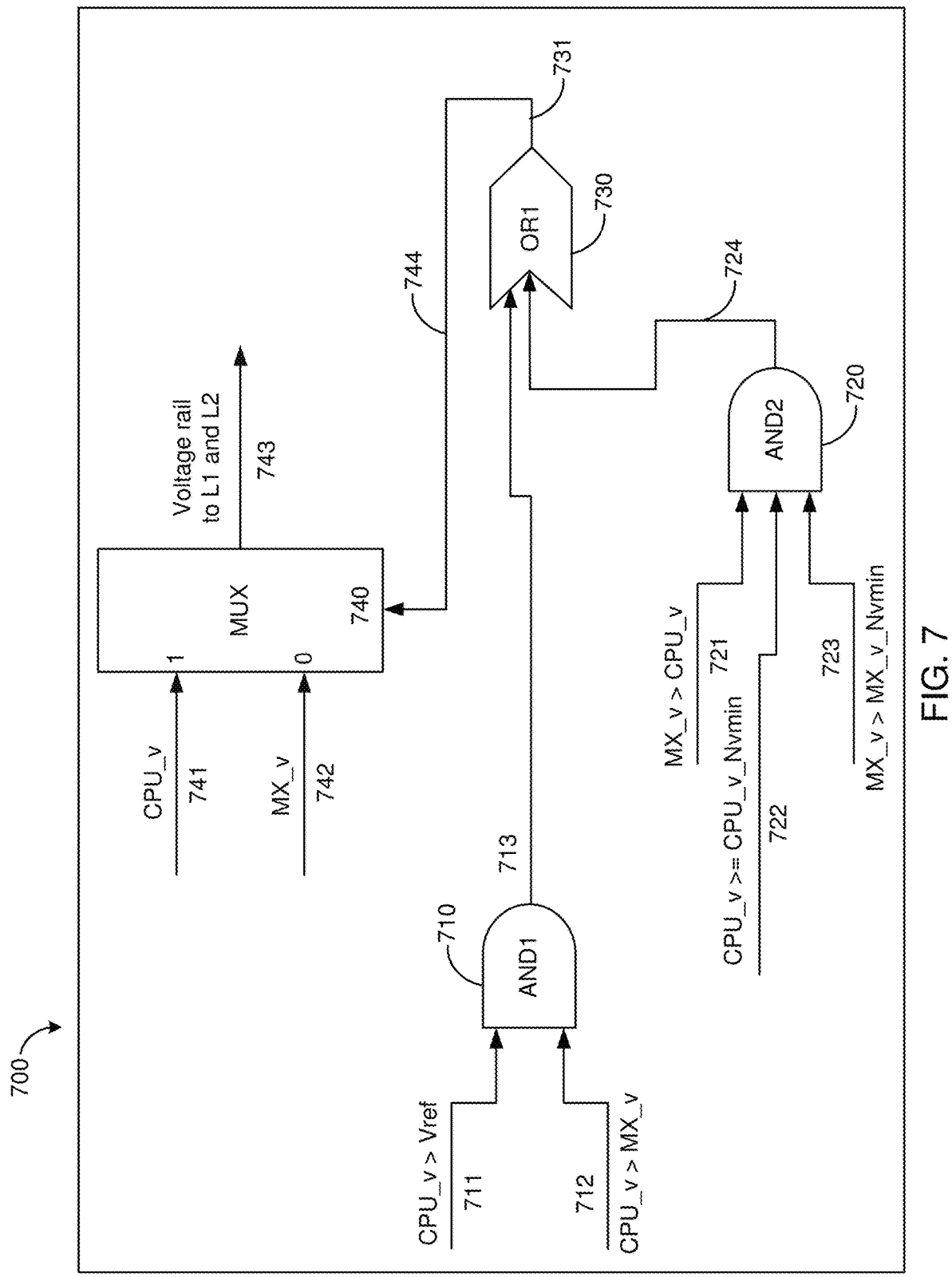
FIG. 7 illustrates an example of a second implementation of control logic.

FIG. 7 illustrates an example of a second implementation of control logic 700. In one example, a two-input AND logical function AND1 710 accepts a first input CPU_v>Thr1 711 and a second input CPU_v>MX_v 712. In one example, Thr1=Vref. In one example, the two-input AND logical function AND1 710 produces a first output 713 which has a value ONE (i.e., TRUE) if and only if both the first input 711 and the second input 712 have the value ONE (i.e., if both are TRUE). Otherwise, the first output 713 has a value ZERO (i.e., FALSE). In one example, the first output 713 is sent to a two-input OR logical function OR1 730. In one example, the two-input AND logical function AND1 710 may be replaced by a plurality of NAND logical functions and/or a plurality of NOR logical functions or the combination thereof.

In one example, a three-input AND logical function AND2 720 accepts a third input MX_v>CPU_v 721, a fourth input CPU_v>CPU_v_Nvmin 722 and a fifth input MX_v>MX_v_Nvmin 723. In one example, CPU_v_Nvmin 722 is a minimum processor voltage CPU_v and MX_v_Nvmin 723 is a minimum memory voltage. In one example, the minimum processor voltage CPU_v_Nvmin 722 is based on silicon characterization for the processor voltage CPU_v. In one example, the minimum memory voltage MX_v_Nvmin 723 is based on silicon characterization for the memory voltage MX_v. In one example, silicon characterization involves operation at operational corners of a silicon-based integrated circuit. In one example, the three-input AND logical function AND2 720 may be replaced by a plurality of NAND logical functions and/or a plurality of NOR logical functions or the combination thereof.

In one example, the three-input AND logical function AND2 720 produces a second output 724 which has a value ONE (i.e., TRUE) if and only if the third input 721, the fourth input 722 and the fifth input 723 all have the value ONE (i.e., if all three inputs are TRUE). Otherwise, the second output 724 has a value ZERO (i.e., FALSE). In one example, the second output 724 is sent to the two-input OR logical function OR1 730. In one example, the two-input OR logical function OR1 730 may be replaced by a plurality of NAND logical functions and/or a plurality of NOR logical functions or the combination thereof.

In one example, the two-input OR logical function OR1 730 accepts the first output 713 and the second output 724 as inputs to generate a third output 731. In one example, the third output 731 has a value ONE (i.e., TRUE) if either or both the first output 713 and the second output 724 have the value ONE (i.e., if at least one of the first output 713 and the second output 724 is TRUE). In one example, the third output 731 from the two-input OR logical function OR1 730 serves as a select line 744 for multiplexer 740. In one example, the multiplexer 740 accepts a first mux input CPU_v 741 and a second mux input MX_v 742. In one example, the multiplexer 740 selects either the first mux input 741 or the second mux input 742 as a mux output 743, depending on the state of the select line 744. For example, if the select line has a value ZERO (i.e., FALSE), the mux output 743 is set to the first mux input 741. For example, if the select line has a value ONE (i.e., TRUE), the mux output 743 is set to the second mux input 742. In one example, the mux output 743 serves as a selected voltage rail for a plurality of cache memories. In one example, the multiplexer 740 may be replaced by a processor, by a combinatorial circuit or by a switch to perform the functions disclosed herein. In one example, the above logical functions using the two-input AND logical function AND1 710, the three-input AND logical function AND2 720 and the two-input OR logical function OR1 730 may be implemented using other equivalent Boolean operations to synthesize an alternative implementation of control logic 700. In one example, assignment of mux inputs to multiplexer 740 maybe swapped with a different, but logically equivalent architecture.

In one example, the second implementation of control logic 700 modifies the selection of dc power domain for scenario 2 of Table 1 (i.e., for a scenario where the processor voltage (e.g., CPU_v) is at or below nominal processor voltage level and the memory voltage (e.g., MX_v) is above nominal memory voltage level, that is, the PerfLevel_1.

In one example, the following Table 3 illustrates a comparison of selected voltage rail for the first logic control logic flow and the second control logic flow given mux inputs.

narios, as described above in Table 3. In one example, the processor de power savings may be approximately 6-7% through usage of the second logic control over the first logic control. In one example, the overall system on a chip (SoC) dc power savings may be approximately 1-2% through usage of the second logic control over the first logic control.

Figure 8:
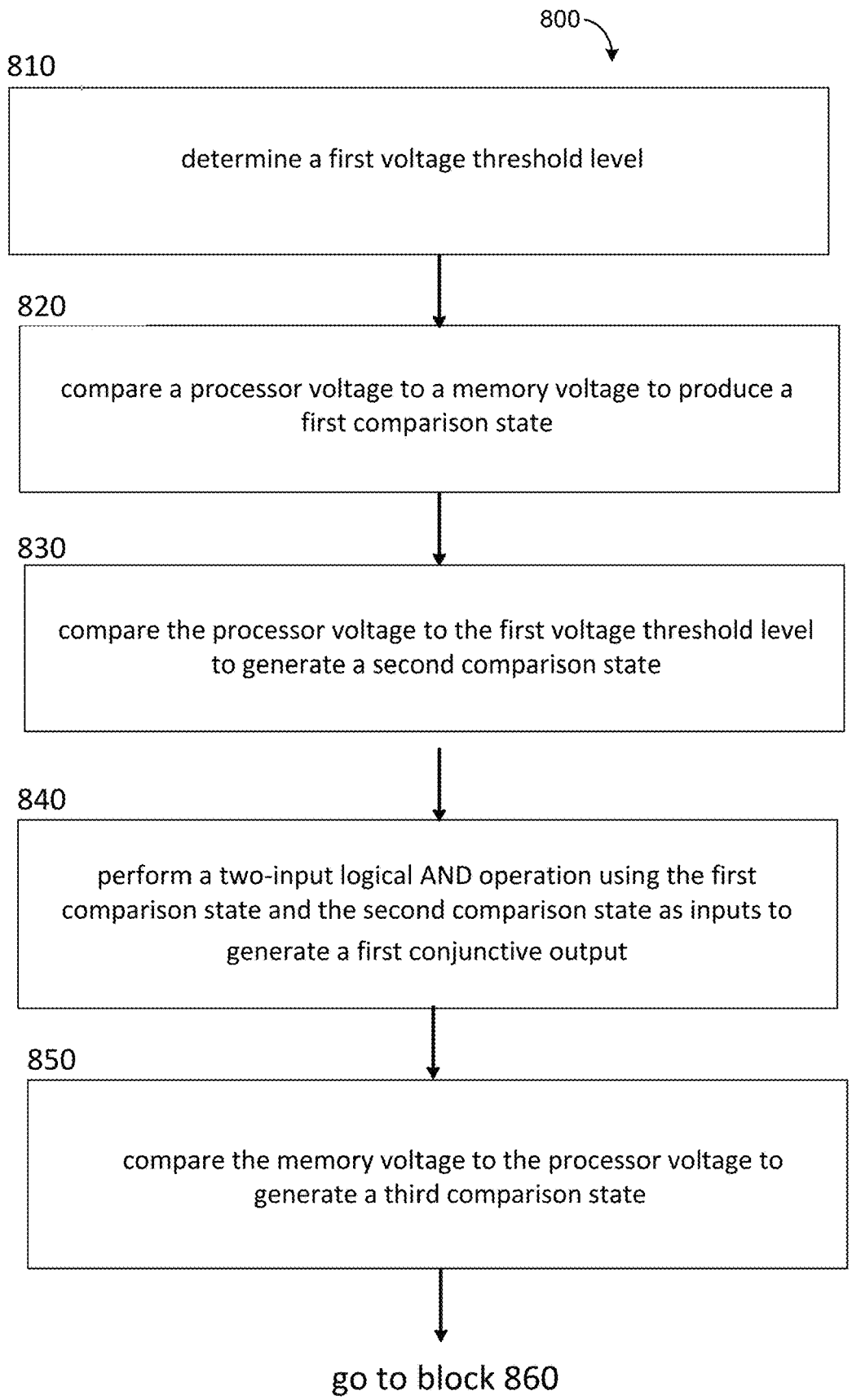
FIG. 8 illustrates an example flow diagram for electrical load voltage rail selection.

FIG. 8 illustrates an example flow diagram 800 for electrical load voltage rail selection. In block 810, determine a first voltage threshold level Thr1. In one example, the first voltage threshold level Thr1 is determined. In one example, the first voltage threshold level Thr1 is a nominal processor voltage. In one example, the first voltage threshold level Thr 1=Vref.

In block 820, compare a processor voltage CPU_v to a memory voltage MX_v to produce a first comparison state. In one example, a processor voltage CPU_v is compared to a memory voltage MX_v to produce a first comparison state. If the processor voltage CPU_v is greater than the memory voltage MX_v, then set the first comparison state to TRUE (i.e., ONE). If the processor voltage CPU_v is not greater than the memory voltage MX_v, then set the first comparison state to FALSE (i.e., ZERO).

In block 830, compare the processor voltage CPU_v to the first voltage threshold level Thr1 to generate a second comparison state. In one example, the processor voltage CPU_v is compared to the first voltage threshold level Thr1 to generate a second comparison state. If the processor voltage CPU_v is greater than the first voltage threshold level Thr1, then set the second comparison state to TRUE (i.e., ONE). If the processor voltage CPU_v is not greater than the first voltage threshold Thr1, then set the second comparison state to FALSE (i.e., ZERO).

In block 840, perform a two-input logical AND operation using the first comparison state and the second comparison state as inputs to generate a first conjunctive output (i.e., first logical AND output). In one example, a two-input logical AND operation is performed using the first comparison state and the second comparison state as inputs to generate a first conjunctive output (i.e., first logical AND output).

TABLE 3

Comparison of selected dc power domain.

| Processor voltage CPU_v | Memory voltage MX_v | First logic control | Second logic control |
|---|---|---|---|
| SVS_L1 | Nominal | MX_v | MX_v |
| SVS/LowSVS/LowSVS_D1 | SVS | MX_v | MX_v |
| Nominal | Nominal | MX_v | MX_v |
| Nominal | Nominal_L1 | MX_v | CPU_v |
| Nominal/Nominal_L1 | Turbo | MX_v | CPU_v |
| Nominal, Turbo | Turbo_L1 | MX_v | CPU_v |
| Turbo | Turbo | MX_v | MX_v |
| Turbo_L1/Turbo_L3 | Turbo | CPU_v | CPU_v |

In one example, Table 3 illustrates input conditions for the processor voltage CPU_v and the memory voltage MX_v which govern selection of the voltage rail for cache memories. In one example, the second logic control changes selection of the voltage rail from MX_v to CPU_v relative to the first logic control under three different scenarios. In one example, SVS, LowSVS, LowSVS_D1, Nominal, Nominal_L1, Turbo, Turbo_L1 and Turbo_L3 may be different performance levels applied across a variety of workloads. For example, each performance level has an associated voltage and a respective level frequency.

In one example, usage of the second logic control improves cache memory de power consumption performance (i.e., lower dc power consumption) for several sce- In one example, if the first comparison state and the second comparison state are both TRUE (i.e., both set to ONE), then set the first conjunctive output to TRUE (i.e., ONE). In one example, if either the first comparison state or the second comparison state is FALSE or if both the first comparison state and the second comparison state are both FALSE, then set the first conjunctive output to FALSE (i.e., ZERO).

In block 850, compare the memory voltage MX_v to the processor voltage CPU_v to generate a third comparison state. In one example, the memory voltage MX_v is compared to the processor voltage CPU_v to generate a third comparison state. In one example, if the memory voltage MX_v is greater than the processor voltage CPU_v, then set the third comparison state to TRUE (i.e., ONE). In one example, if the memory voltage MX_v is not greater than the processor voltage CPU_v, then set the third comparison state to FALSE (i.e., ZERO).

In block 860, compare the processor voltage CPU_v to a minimum processor voltage CPU_v_Nvmin to generate a fourth comparison state. In one example, the processor voltage CPU_v is compared to a minimum processor voltage CPU_v_Nvmin to generate a fourth comparison state. In one example, if the processor voltage CPU_v is greater than or equal to the minimum processor voltage CPU_v_Nvmin, then set the fourth comparison state to TRUE (i.e., ONE). In one example, if the processor voltage CPU_v is less than the minimum processor voltage CPU_v_Nvmin, then set the fourth comparison state to FALSE (i.e., ZERO). In one example, the minimum processor voltage CPU_v_Nvmin is based on silicon characterization for the processor voltage CPU_v.

In block 870, compare the memory voltage MX_v to a minimum memory voltage MX_v_Nvmin to generate a fifth comparison state. In one example, the memory voltage MX_v is compared to a minimum memory voltage MX_v_Nvmin to generate a fifth comparison state. In one example, if the memory voltage MX_v is greater than or equal to the minimum memory voltage MX_v_Nvmin, then set the fifth comparison state to TRUE (i.e., ONE). In one example, if the memory voltage MX_v is less than the minimum memory voltage MX_v_Nvmin, then set the fifth comparison state to FALSE (i.e., ZERO). In one example, the minimum memory voltage MX_v_Nvmin is based on silicon characterization for the memory voltage MX_v.

In block 880, perform a three-input logical AND operation using the third comparison state, the fourth comparison state and the fifth comparison state as inputs to generate a second conjunctive output (i.e., second logical AND output). In one example, a three-input logical AND operation is performed using the third comparison state, the fourth comparison state and the fifth comparison state as inputs to generate a second conjunctive output (i.e., second logical AND output).

In one example, if the third comparison state, the fourth comparison state and the fifth comparison state are all TRUE (i.e., all three inputs set to ONE), then set the second conjunctive output to TRUE (i.e., ONE). In one example, if any of the third comparison state, the fourth comparison state and the fifth comparison state are FALSE, then set the second conjunctive output to FALSE (i.e., ZERO).

In block 890, perform a two-input logical OR operation using the first conjunctive output and the second conjunctive output to generate a disjunctive output (i.e., logical OR output). In one example, a two-input logical OR operation is performed using the first conjunctive output and the second conjunctive output to generate a disjunctive output (i.e., logical OR output). In one example, if at least one of the first conjunctive output and the second conjunctive output is TRUE (i.e., at least one is set to ONE), then set the disjunctive output to TRUE (i.e., ONE). In one example, if both of the first conjunctive output and the second conjunctive output are FALSE (i.e., both set to ZERO), then set the disjunctive output to FALSE (i.e., ZERO).

In block 900, set the disjunctive output to a select line for a two-input multiplexer to select either the processor voltage CPU_v or the memory voltage MX_v as a voltage rail for an electrical load. In one the disjunctive output is set to a select line for a two-input multiplexer to select either the processor voltage CPU_v or the memory voltage MX_v as a voltage rail for an electrical load. In one example, the electrical load is a cache memory or a plurality of cache memories. In one example, if the disjunctive output is TRUE (i.e., ONE), then select the processor voltage CPU_v as the voltage rail for the electrical load. In one example, if the disjunctive output is FALSE (i.e., ZERO), then select the memory voltage MX_v as the voltage rail for the electrical load. In one example, configuration of the two-input multiplexer may be altered with interchanged inputs and a revised logic architecture to perform equivalent operations as disclosed herein.

In one aspect, one or more of the steps for electrical load voltage rail selection in FIG. 8 may be executed by one or more processors which may include hardware, software, firmware, etc. The one or more processors, for example, may be used to execute software or firmware needed to perform the steps in the flow diagram of FIG. 8. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise.

The software may reside on a computer-readable medium. The computer-readable medium may be a non-transitory computer-readable medium. A non-transitory computer-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The computer-readable medium may also include, by way of example, a carrier wave, a transmission line, and any other suitable medium for transmitting software and/or instructions that may be accessed and read by a computer. The computer-readable medium may reside in a processing system, external to the processing system, or distributed across multiple entities including the processing system. The computer-readable medium may be embodied in a computer program product. By way of example, a computer program product may include a computer-readable medium in packaging materials. The computer-readable medium may include software or firmware. Those skilled in the art will recognize how best to implement the described functionality presented throughout this disclosure depending on the particular application and the overall design constraints imposed on the overall system.

Any circuitry included in the processor(s) is merely provided as an example, and other means for carrying out the described functions may be included within various aspects of the present disclosure, including but not limited to the instructions stored in the computer-readable medium, or any other suitable apparatus or means described herein, and utilizing, for example, the processes and/or algorithms described herein in relation to the example flow diagram.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another even if they do not directly physically touch each other. The terms "circuit" and "circuitry" are used broadly, and intended to include both hardware implementations of electrical devices and conductors that, when connected and configured, enable the performance of the functions described in the present disclosure, without limitation as to the type of electronic circuits, as well as software implementations of information and instructions that, when executed by a processor, enable the performance of the functions described in the present disclosure.

One or more of the components, steps, features and/or functions illustrated in the figures may be rearranged and/or combined into a single component, step, feature or function or embodied in several components, steps, or functions. Additional elements, components, steps, and/or functions may also be added without departing from novel features disclosed herein. The apparatus, devices, and/or components illustrated in the figures may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for."

One skilled in the art would understand that various features of different embodiments may be combined or modified and still be within the spirit and scope of the present disclosure.

What is claimed is:

1. An apparatus comprising:
   a two-input AND logical function configured to perform a two-input logical AND operation using a first comparison state and a second comparison state as inputs to generate a first conjunctive output;
   a three-input AND logical function configured to perform a three-input logical AND operation using a third comparison state, a fourth comparison state and a fifth comparison state as inputs to generate a second conjunctive output;
   a two-input OR logical function coupled to the two-input AND logical function and the three-input AND logical function, the two-input OR logical function configured to perform a two-input logical OR operation using the first conjunctive output and the second conjunctive output to generate a disjunctive output; and
   a multiplexer coupled to two-input OR logical function, the multiplexer configured to select either a processor voltage or a memory voltage as a voltage rail for an electrical load.

2. The apparatus of claim 1, wherein the two-input AND logical function is further configured to receive a first comparison of the processor voltage and the memory voltage.

3. The apparatus of claim 2, wherein the two-input AND logical function is further configured to receive a second comparison of the processor voltage and a voltage threshold level.

4. The apparatus of claim 3, wherein the two-input AND logical function is further configured to receive the first comparison state and the second comparison state.

5. The apparatus of claim 4, wherein the two-input AND logical function is further configured to set the disjunctive output to a select line for a two-input multiplexer to select either the processor voltage or the memory voltage as the voltage rail for the electrical load.

6. A method comprising:
   performing a two-input logical AND operation using a first comparison state and a second comparison state as inputs to generate a first conjunctive output;
   performing a three-input logical AND operation using a third comparison state, a fourth comparison state and a fifth comparison state as inputs to generate a second conjunctive output;
   performing a two-input logical OR operation using the first conjunctive output and the second conjunctive output to generate a disjunctive output; and
   setting the disjunctive output to a select line for a two-input multiplexer to select either a processor voltage or a memory voltage as a voltage rail for an electrical load.

7. The method of claim 6, further comprising comparing the processor voltage to the memory voltage to generate the first comparison state.

8. The method of claim 7, further comprising comparing the processor voltage to a voltage threshold level to generate the second comparison state.

9. The method of claim 8, further comprising setting the first conjunctive output to TRUE if the first comparison state and the second comparison state are both TRUE; or setting the first conjunctive output to FALSE if either or both of the first comparison state and the second comparison state is FALSE.

10. The method of claim 8, further comprising comparing the memory voltage to the processor voltage to generate the third comparison state.

11. The method of claim 10, further comprising comparing the processor voltage to a minimum processor voltage to generate the fourth comparison state.

12. The method of claim 11, further comprising comparing the memory voltage to a minimum memory voltage to generate the fifth comparison state.

13. The method of claim 12, further comprising setting the second conjunctive output to TRUE if the third comparison state, the fourth comparison state and the fifth comparison state are all TRUE, or setting the second conjunctive output to FALSE if any of the third comparison state, the fourth comparison state or the fifth comparison state is FALSE.

14. The method of claim 12, further comprising determining the voltage threshold level.

15. The method of claim 12, further comprising setting the disjunctive output to TRUE if at least one of the first conjunctive output and the second conjunctive output is TRUE, or setting the disjunctive output to FALSE if both of the first conjunctive output and the second conjunctive output are FALSE.

16. The method of claim 12, further comprising selecting the processor voltage as the voltage rail for the electrical load if the disjunctive output is TRUE, or selecting the memory voltage as the voltage rail for the electrical load if the disjunctive output is FALSE.

17. An apparatus comprising:
   means for performing a two-input logical AND operation using a first comparison state and a second comparison state as inputs to generate a first conjunctive output;
   means for performing a three-input logical AND operation using a third comparison state, a fourth comparison state and a fifth comparison state as inputs to generate a second conjunctive output;
   means for performing a two-input logical OR operation using the first conjunctive output and the second conjunctive output to generate a disjunctive output; and
   means for setting the disjunctive output to a select line for a two-input multiplexer to select either a processor voltage or a memory voltage as a voltage rail for an electrical load.

18. The apparatus of claim 17, further comprising means for selecting the processor voltage as the voltage rail for the electrical load if the disjunctive output is TRUE, or for selecting the memory voltage as the voltage rail for the electrical load if the disjunctive output is FALSE.

19. The apparatus of claim 18, further comprising means for setting the second conjunctive output to TRUE if the third comparison state, the fourth comparison state and the fifth comparison state are all TRUE, or for setting the second conjunctive output to FALSE if any of the third comparison state, the fourth comparison state or the fifth comparison state is FALSE.

20. The apparatus of claim 19, further comprising means for setting the disjunctive output to TRUE if at least one of the first conjunctive output and the second conjunctive output is TRUE, or for setting the disjunctive output to FALSE if both of the first conjunctive output and the second conjunctive output are FALSE.

* * * * *